United States Patent [19]

Antoshenkov et al.

[11] Patent Number: 5,585,793
[45] Date of Patent: Dec. 17, 1996

[54] ORDER PRESERVING DATA TRANSLATION

[75] Inventors: Gennady Antoshenkov, Amherst, N.H.; David B. Lomet, Westford, Mass.; James C. Murray, Nashua, N.H.

[73] Assignee: Digital Equipment Corporation, Maynard, Mass.

[21] Appl. No.: 258,144

[22] Filed: Jun. 10, 1994

[51] Int. Cl.$^6$ ...................................................... H03M 7/30
[52] U.S. Cl. ............................... 341/51; 341/67; 341/106; 341/50; 364/462.3
[58] Field of Search ....................... 341/50, 51, 67, 341/106; 364/962–963.5

[56] References Cited

U.S. PATENT DOCUMENTS

| | | | |
|---|---|---|---|
| 4,558,302 | 12/1985 | Welch | 340/347 |
| 4,677,550 | 6/1987 | Ferguson | 364/300 |
| 5,270,712 | 12/1993 | Iyer et al. | 341/50 |
| 5,325,091 | 6/1994 | Kaplan et al. | 341/51 |
| 5,394,143 | 2/1995 | Murray et al. | 341/63 |
| 5,406,279 | 4/1995 | Anderson et al. | 341/51 |
| 5,410,671 | 4/1995 | Elgamal et al. | 395/425 |
| 5,525,982 | 6/1996 | Cheng et al. | 341/51 |

OTHER PUBLICATIONS

Knuth, D., "The Art Of Computer Programming", Second Edition, vol. 1, Fundamental Algorithms, pp. 402–404.

Knuth, D., "The Art Of Computer Programming", vol. 3, Sorting and Searching, pp. 439–445.

Blasgen, M., et al, "An Encoding Method For Multifield Sorting and Indexing", Association for Computing Machinery, Inc., Dec. 1976.

Held, G., "Data Compression", Chapters 2 and 3, 3rd Edition.

Bayer, R., et al, "Prefix B–Trees", ACM Transactions On Database Systems, vol. 2, No. 1, Mar. 1977.

Zandi, A., et al, "Sort Order Preserving Data Compression for Extended Alphabets", Data Compression Conference, 1993 IEEE, pp. 330–339.

Ziv, J., et al, "Compression of Individual Sequences Via Variable–Rate Coding", IEEE Transactions on Information Theory vol. IT–24, No. 5, Sep. 1978, pp. 530–536.

Ziv, J., et al, "A Universal Algorithm for Sequential Data Compression", IEEE Transactions On Information Theory, vol., IT–23, No. 3, May 1977, pp. 337–343.

*Primary Examiner*—Jeffrey A. Gaffin
*Assistant Examiner*—Jason L. W. Kost
*Attorney, Agent, or Firm*—Dirk Brinkman

[57] ABSTRACT

In a computer system, input strings to be translated are composed of characters selected from a first alphabet. According to a predetermined criterion, a list of sub-strings is selected from the input strings to form entries in a dictionary. The entries of the dictionary are arranged according to a collating order of the first alphabet. An interval including the sub-strings of the input strings is partitioned into an all-inclusive and disjoint set of ranges. The sub-strings of the interval are arranged according to the collating order of the first alphabet, and each sub-strings of a particular range has a common prefix, the common prefix selected from the list of sub-strings. A unique encoding is assigned to each common prefix, the corresponding set of unique encodings composed of characters selected from a second alphabet. The input strings are parsed, one at the time, into a plurality of tokens, each token corresponding to a sub-string selected from the dictionary. In an output string, there is placed for each token, a corresponding one of the set of unique encodings.

10 Claims, 14 Drawing Sheets

| Range | Pattern | Encodings | |
|---|---|---|---|
| [A:AAA) | A | E1 | 621 |
| [AAA:AAA] | AAA | E2 | 622 |
| (AAA:AB) | A | E3 | 623 |
| [AB:AC) | AB | E4 | 624 |
| [AC:B) | AC | E5 | 625 |
| [B:BB) | B | E6 | 626 |
| [BB:BBB) | BB | E7 | 627 |
| [BBB:BBB] | BBB | E8 | 628 |
| (BBB:C) | B | E9 | 629 |
| [C:C] | C | E10 | 630 |

810 — Let IN represent an input string to be translated

820 — Let OUT represent the translated output strings, initially empty

830 — Let D[] represent the encoding dictionary

840 — Let $R_i$, $P_i$, and $E_i$ be the values associated with entries of D[]

850 — Do while IN no empty

860 — For i = 1 to N Search D[] for the $R_i$ that contains IN

870 — IN is truncated by $P_i$

880 — OUT is OUT concatenated with $E_i$

910 — Let STR1 be prefix string,

Let STR2 be suffix string,

Let HIGH (STR) be highest sub-string, and

Let LOW (STR) be lowest sub-string.

920 — If ENCODE (STR1) is a prefix to ENCODE (STR2)

then, ENCODE (STR1) || ENCODE (HIGH (STR1))
< ENCODE(STR2)

930 — IF ENCODE (STR2) is a prefix to ENCODE (STR1)

then, ENCODE (STR2) || ENCODE (LOW(STR2))
> ENCODE (STR1)

*Fig. 9*

ORDER PRESERVING DATA TRANSLATION

FIELD OF THE INVENTION

This invention relates generally to parsing and translating data, and more particularly to order preserving data compression.

BACKGROUND OF THE INVENTION

In computer systems, the operation of translating data is a frequent, and often time consuming task. Data can be a natural language text, a program, an index to a database, a set of numbers, or a representation of a physical phenomena, for example, an image. Translating data may consume a large amount of computer resources such as memory and processing cycles. During translation, data can be compressed. It is well known that compressed data can reduce the amount of computer resources consumed.

Many techniques are known for "lossless" data compression. Lossless means that the original data is bit-by-bit fully recoverable from the compressed data. However, most compression techniques do not preserve the ordering of the compressed data. There are important reasons for wanting data compression that is order preserving. Order preserving compression techniques facilitate both sorting and searching.

For example, key sorting is a method where one extracts the sort value, e.g., the key of each record of a database, and stores the key with a record pointer or address in an index as a set of character strings. The strings are sorted according to the value of the keys. The sorted index can be used to retrieve the records in the sorted order. This is much more efficient than tediously sorting the entire records.

Therefore, order preserving data compression can reduce the size of the key, and can speed-up comparisons and moves. There is an especially large payoff for compressing multi-field keys which are frequently extended to a fixed length with blank padding characters.

Arithmetic compression could be used for order preserving data compression. Arithmetic compression is based on knowing the probabilities of the data to be encoded. Arithmetic compression works by adding cumulative probabilities to the calculated results of prior encodings. The probability calculations preserve ordering when the cumulative probabilities are based on data organized in a sorted order. Arithmetic encoding techniques require slow-to-execute arithmetic instructions, and typically operate on the data to be compressed one byte at the time. However, in key sorting, where every key needs to be compressed prior to sorting, one needs a compression technique which works at a very high speed.

Dictionary approaches, which do simple look-ups on units, e.g., tokens, of multiple symbols, can be much faster than arithmetic compression techniques. Furthermore, a dictionary approach can be very closely tailored to a specific data compression problem. For example, one might compress only specific sequences of data for which there are dictionary entries.

For ordered data, it is important that the data compression technique be "static" and order preserving. In non-static or adaptive compression, an encoding dictionary can be built dynamically, detecting and adapting to localized frequency patterns as the data are compressed. Non-static compression can be used for large natural language texts, where there is no requirement to compare the compressed text with other compressed texts.

In contrast, if it is desired to compress many small sets of data, such as index keys, the compressed form of the data needs to deliver the same result upon comparison as the original uncompressed data. Therefore, the encoding dictionary must be built once, and remain unchanged, e.g., static. In this case, adaptation is not possible because no individual property of the data can influence the structure of the encoding dictionary.

Only a static compression technique will preserve the order over time, which is important in both searching and sorting. This rules out many of the most powerful adaptive techniques, such as those based on the well-known Ziv-Lempel method, "Compression of Individual Sequences Via Variable-Rate Coding" J. Ziv, A. Lempel, IEEE Trans. Information Theory, IT-24, 5 (Sept. 1978) 530–536. Such methods are more attuned to the compression of large natural language texts.

Also, the need to preserve order eliminates many dictionary techniques such as Huffman encoding. "The Art of Computing Programming", Vol. 1, Fundamental Algorithms, and Vol. 3, Sorting and Searching. D. Knuth, Addison Wesley (1973) Reading, Mass.

One systematic method of performing order preserving data compression is the so-called Hu-Tucker method, see Knuth cited above. In the Hu-Tucker method, a translation dictionary is built, usually in the form of an optimal weighted binary tree, where the weights of the nodes of the tree are based on the frequency of occurrence of the dictionary entries. The entries constitute a "dictionary" of tokens to be compressed. The weighted nodes cannot be re-arranged arbitrarily because the order of the compressed forms needs to be the same as the order of the original entries.

However, the Hu-Tucker method also has limitations. The Hu-Tucker method does not address the problem of how to parse the data. This problem needs to be solved so as to permit correct ordering of dictionary entries. In particular, one needs to solve the problem of ordering entries when one entry is a "prefix" of another second entry.

Because of limitations during the decoding of Hu-Tucker compressed data, the entries in the Hu-Tucker dictionary are required to observe the "prefix property". The prefix property holds that no entry of the dictionary can be a prefix to any other entry of the dictionary. Effective and flexible data compression can be better performed if the prefix property for the encoded data are not required.

Therefore, there is a need for a translating method which can be used for order preserving data compression. It would be advantageous if the translating method can also be applied to traditional non-order preserving compression techniques. Further advantages can be gained if the same translating method can be used for encoding and decoding data.

SUMMARY OF THE INVENTION

In a computer system, a set of input strings to be translated are composed of characters selected from a first alphabet. According to a predetermined criterion, a list of sub-strings is selected from the input strings. The list of sub-strings is arranged according to a collating order of the first alphabet. All possible sub-strings of the input strings are arranged in an interval according to the collating order of the first alphabet. The interval of all possible sub-strings is partitioned into an all-inclusive and disjoint set of ranges. All the sub-strings of any particular range have a common prefix. The common prefix is selected from the list of sub-strings. A unique encoding is assigned to each range to produce a set of encodings. The set of encodings is composed of characters selected from a second alphabet. The input strings, one at the time, are parsed into a plurality of tokens, each token corresponding to a sub-string selected from the list of sub-string. In an output string, there is placed for each token, a corresponding one of the set of unique encodings.

The parsing and encoding of the input string can be performed by a process which compares, in the collated order, each common prefix with a first sub-string of the input string until a match is detected. The length of the first sub-string is the same as the length of each common prefix. In response to detecting the match, the input string is truncated by the first sub-string. The unique encoding assigned to the matching common prefix is concatenated into an output string, which, initially, can be a null string. The comparing, truncating, and concatenating steps can be repeated until the input string is completely consumed, at which time the output string will contain the translated input strings.

In another aspect of the invention, each unique encoding is assigned to each corresponding common prefix in a collating order of the second alphabet to enable translation in an order preserving manner.

BRIEF DESCRIPTION OF THE DRAWINGS

FIG. 6 is a table representing an encoding dictionary;

FIG. 8 details the process steps of FIG. 7;

FIG. 9 shows the process steps for ordering encoding of the dictionary of FIG. 6;

DETAILED DESCRIPTION OF A PREFERRED EMBODIMENT

Figure 1:
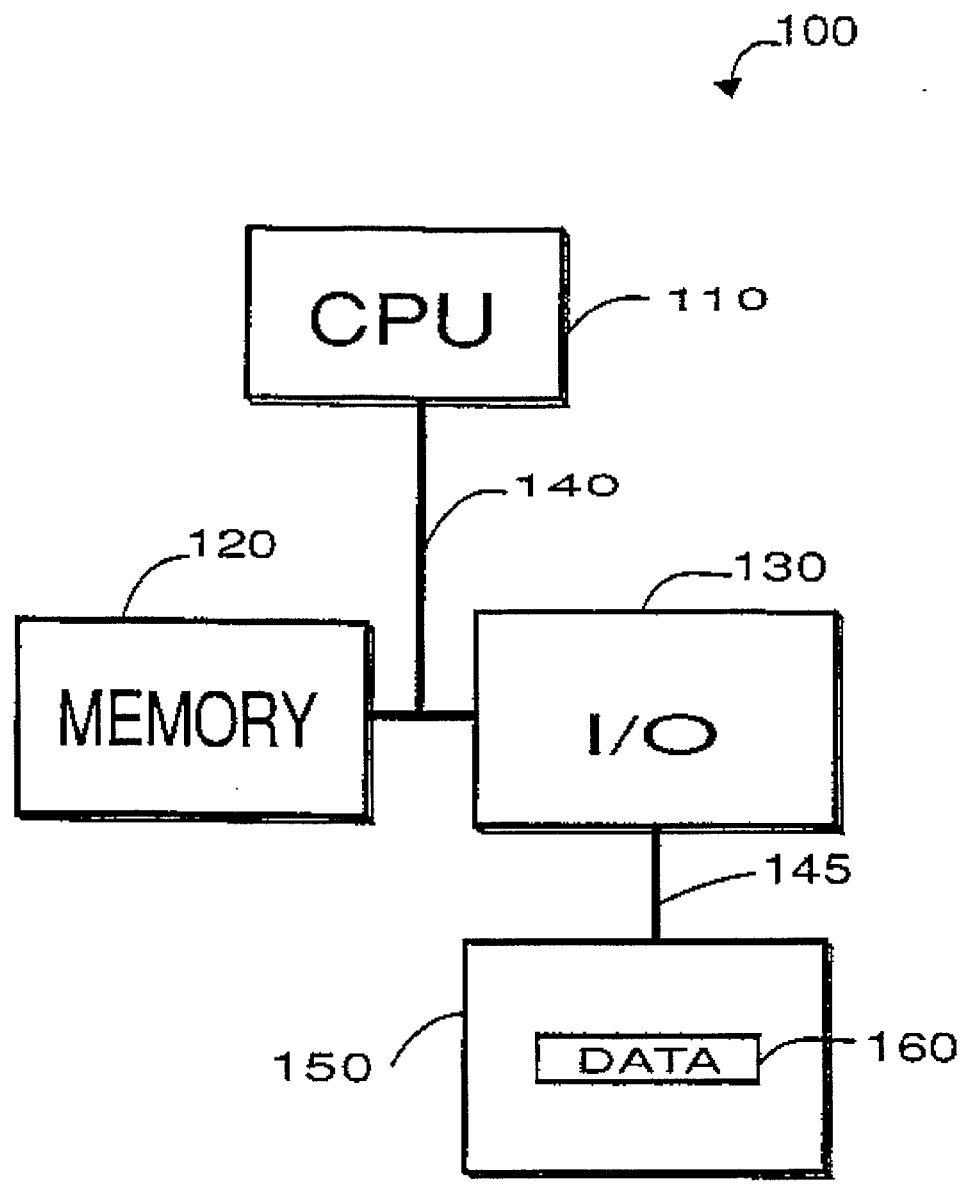
FIG. 1 shows a block diagram of a computer system which can use the translating method of the invention.

FIG. 1 shows a computer system 100 including, for example, a central processor unit (CPU) 110, a fast memory 120, and I/O sub-system 130 connected to each other by a communications bus 140. A bulk memory, for example, a disk 150, can be connected to the I/O sub-system 130 by an I/O bus 145.

During operation of the computer system 100, the CPU 110 can process data stored in the memory 120 using instructions also stored in the memory 120. The data stored in the memory 120 may be part of a larger collection of data 160 stored in the disk 150.

A frequently performed task by the computer system 100 is to search and sort the data 160. A substantial amount of time and costly system resources, for example, processing cycles and I/O operations can be consumed searching and sorting the data 160. The consumption of these resources can be reduced if the data are translated into a compressed form according to the principles of the invention.

Figure 2:
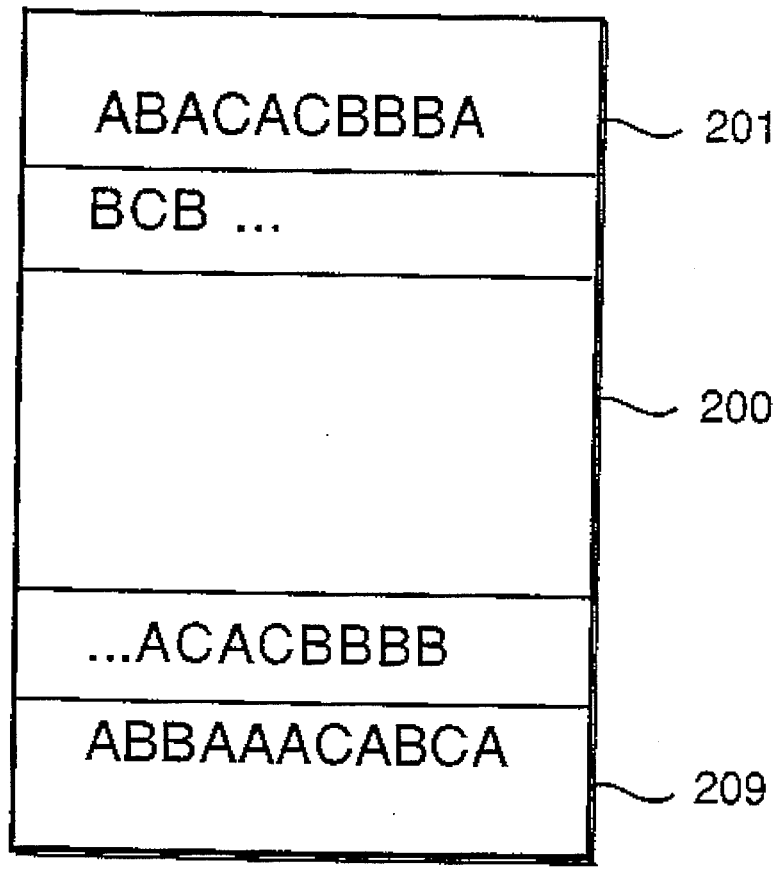
FIG. 2 is a block diagram of strings of data to be translated.

FIG. 2 shows a collection of data to be translated by the computer system 100. The data can be arranged as characters in a plurality of strings 200. The strings 201–209, to simplify the example, can be composed of an alphabet consisting of the characters "A", "B" and "C". The translating technique of the invention can also be applied to variable length strings composed of other alphabets, for example, numeric data or bit strings. It is assumed for now, that each character consumes one byte of storage and is stored as an ASCII code. In a preferred embodiment of the invention, the strings 200 can be parsed and encoded, e.g., translated, into a compressed form using an encoding dictionary.

Figure 3:
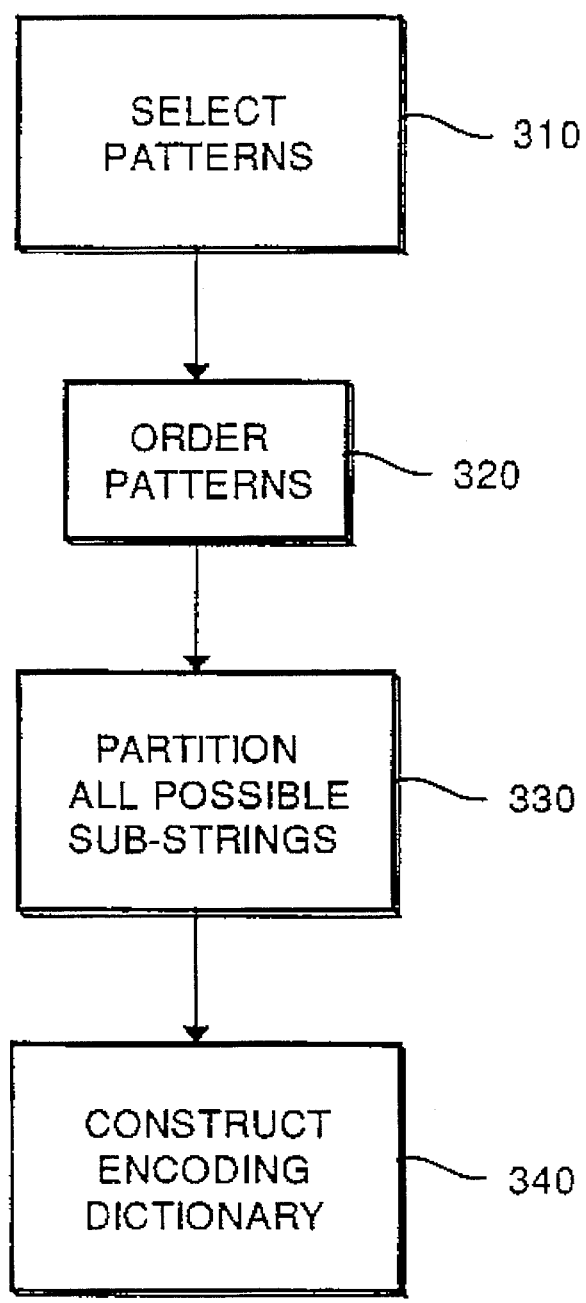
FIG. 3 is a flow diagram of a process to construct an encoding dictionary.

FIG. 3 shows a process which can be used to construct an encoding dictionary for translating the strings 200 of FIG. 2. In step 310, the strings 200 are analyzed to identify and select sub-strings or "patterns" which are frequently occurring. Typically, the most frequently occurring patterns of characters will yield the biggest gain for the least amount of effort. Any known pattern recognition technique may be used in step 310 to identify a set of frequently occurring patterns in the strings 200. For example, random samples of sub-strings can be taken to yield a frequency distribution of commonly occurring patterns. For many strings, such as natural English text, the distribution of frequently occurring character patterns are readily available. Frequently occurring patterns can also be arbitrarily identified from the context of the strings 200.

Figure 4:
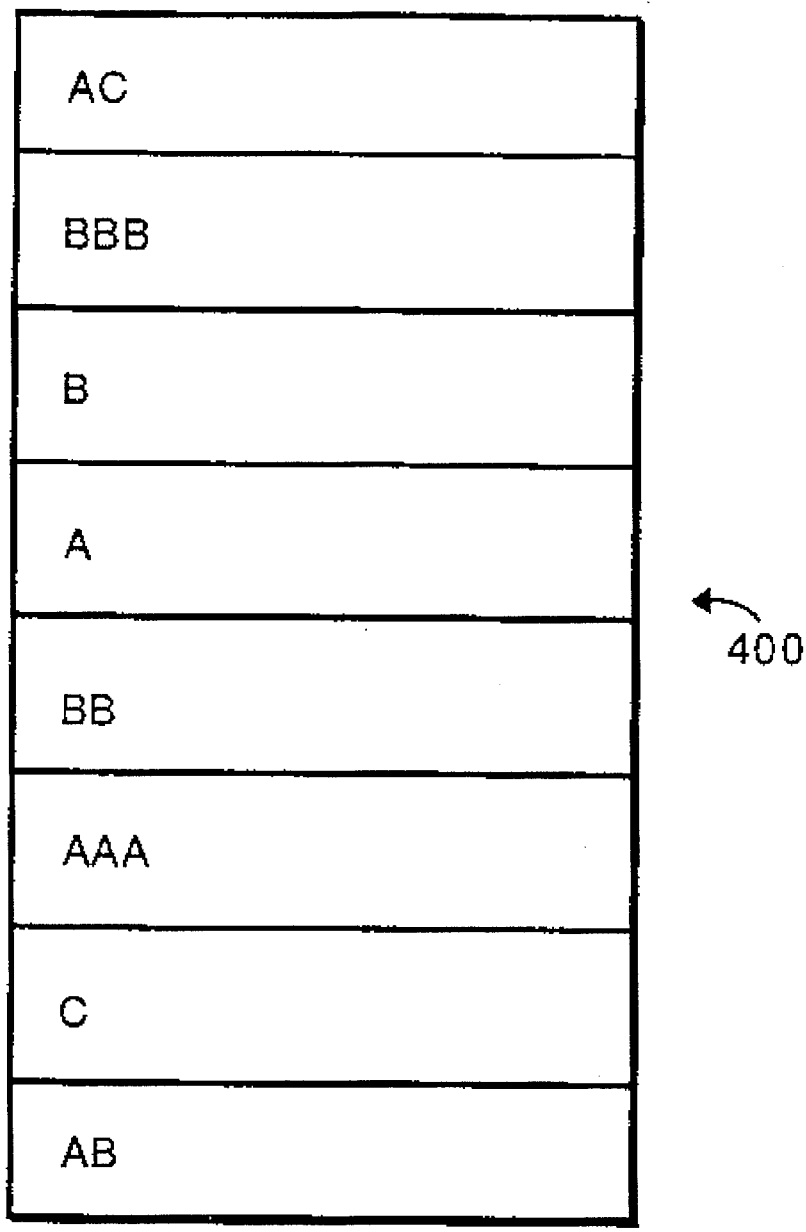
FIG. 4 is a list of character patterns which can be used to parse the strings of FIG. 2.

FIG. 4 shows an example list of patterns 400 which are selected in step 310 as frequently occurring sub-strings in the strings 200.

In step 320 of FIG. 3, the patterns of the list 400 are ordered according to their collating sequence.

Figure 5:
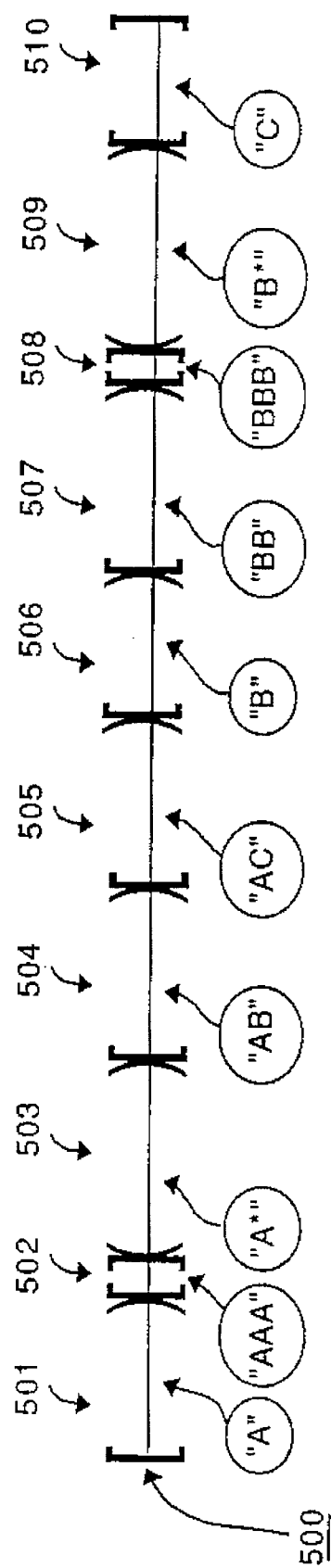
FIG. 5 is schematic diagram of an interval including all possible sub-strings of the strings of FIG. 2.

In step 330, the ordered list of patterns 400 can be used to partition all possible sub-strings of the strings 200 into an all-inclusive and disjoint sets, each set including sub-strings having a range of values, as shown in FIG. 5. Each sub-string includes a "prefix" portion, and possibly a "suffix" portion. Each sub-string of a particular range has the same or common prefix, the prefix being one of the patterns of the list 400. That is, the prefixes of the sub-strings of each set are identical.

In FIG. 5, a line 500 represents the interval of all of the possible sub-strings of the strings 200. The possible sub-strings are arranged according to an order of the alphabet used to compose the strings 200. The symbol "[" and "]" are used to represent "closed" bounds of the ranges, and the symbols "(" and ")" are used to represent "open" bounds. The sets of sub-strings are labelled 501–510. The corresponding patterns of the list 400 which are used to partition the interval are shown below the line 500.

For example, the set 501 represents a range of sub-strings having the pattern "A" as a common prefix, and where the sub-strings, including the suffix, collate before the sub-string "AAA". This range could be expressed as [A:AAA), where "A" and "AAA" represent respectively the upper and lower bounds of the range. The range 502, [AAA:AAA] is a range consisting of all sub-strings beginning with "AAA". The range 503 represents the sub-strings in the range of (AAA:AB) having the pattern "A" as a prefix and where the sub-strings including the suffix collate higher than "AAA" but lower than "AB" for example, the pattern "AAAC", would fall into this range. In FIG. 5, the pattern for range 503 is once again "A". However, the sub-strings of this range, including the suffix, collate higher than "AAA". Here, in range 503, the prefix is shown as "A*" to distinguish it from the prefix "A" of range 501. The range 504 represents sub-strings in the range [AB:AC) having the pattern "AB" as a prefix. The ranges 505–510 can be expressed as [AC:B), [B:BB), [BB:BBB), [BBB,BBB], (BBB:C), and [C:C], respectively.

Note that the range 501 has the same prefix as the range 503. In the range 501, the sub-strings all have a prefix of "A" and may be followed by characters so that the sub-strings in the range 501 collate low with respect to "AAA" the prefix of the following range. In the range 503, the sub-strings also have a prefix of "A", however, here the prefix is followed by characters which make the sub-strings of this range collate high with respect to "AAA". A similar case appears in the ranges 506 and 509 for the prefix "B".

In step 340 of FIG. 3, an encoding dictionary is constructed, using the patterns of FIG. 4 and the ranges of FIG. 5. Although the example dictionary illustrated in FIG. 6 is in tabular form, it should be understood that the dictionary can also assume other forms, for example, as vectors, or tries, described below.

In FIG. 6, the rows 621–630 represent the entries of the dictionary 600, and the columns 610–612 represent the values associated with each entry of the dictionary 600. Column 610 represents, for each row or entry of the dictionary, one of the ranges of the sets 501–510 of FIG. 5. The range of the set of sub-strings is expressed, for example, by the lower and upper bounds of the range. Column 611, represents, for each entry, the common prefix of the respective ranges. As will be discussed below, according to the invention, the values of column 611 also represent "tokens" which are produced when the strings 200 are parsed. Column 612 represents, for each entry, a corresponding encoding for each token of column 611, for example, the encodings E1–E10.

The assignment of values to the encodings E1–E10 depend, in part, on how the dictionary 600 is used. For example, if the dictionary is used to compress data, the encodings E1–E10 should, on an average, occupy less storage space than the tokens. Furthermore, it may be required that the encodings be assigned so as to preserve order during translation. A preferred methodology of assigning encodings will be described below.

The following statements can be made regarding some interesting characteristics of the encoding dictionary 600. Any possible sub-string of the strings 200 falls exactly into one range of the partitioning of all possible sub-strings. This means, advantageously, that input strings can be composed of any combination of the characters of the alphabet. This is called dictionary completeness. If arbitrary strings are to be parsed, a dictionary is usually complete if there is a separate dictionary entry for each character of the string alphabet, see rows 621, 626, and 630.

All of the sub-strings for a particular range share the same prefix. The common prefix is one of the patterns of the list 400. A pattern that is not a prefix of a longer sub-string, e.g., the pattern is the sub-string in its entirety, is the prefix of a range of sub-strings for which it is a prefix. When a particular pattern is a prefix of a longer adjacent sub-string, the prefix of the range bounded by these patterns will be the shorter pattern. Thus, any input string composed of a given alphabet can be parsed unambiguously into tokens.

Also, as shown in the example dictionary 600, a given pattern may need to appear as multiple entries in the dictionary according to its following context. This means that there may not be a one-to-one correspondence between entries of the dictionary 600 and the list of patterns 400. For example, the pattern "A" appears in two entries of the dictionary 600, first as a prefix of the range 501, [A:AAA), and second as the a prefix to the range 503, (AAA:AB). The first occurrence of the pattern "A" is as a prefix of substrings of a range which compare low to sub-strings of a following range, and the second occurrence is as a prefix of sub-strings of a range which compare high to sub-strings of a preceding range. Similarly, the pattern "B" appears as a prefix for the range 506, [B:BB), and the range 509, (BBB:C).

As an advantage, constructing the dictionary 600 in this manner is inherently very flexible. For example, it is not necessary to have an entry in the dictionary for every possible prefix. Thus, there is no explicit range for sub-strings which have "AA" as a prefix, despite the fact that both of the patterns "A" and "AAA" do. Symmetry about a pattern is not required. Thus, the prefix "BB" has an entry for sub-strings which precede "BBB" i.e., when "BB" is either the end of a sub-string, or when the sub-string is followed by an "A". But, there is no comparable entry for "BB" when it follows "BBB".

Figure 7:
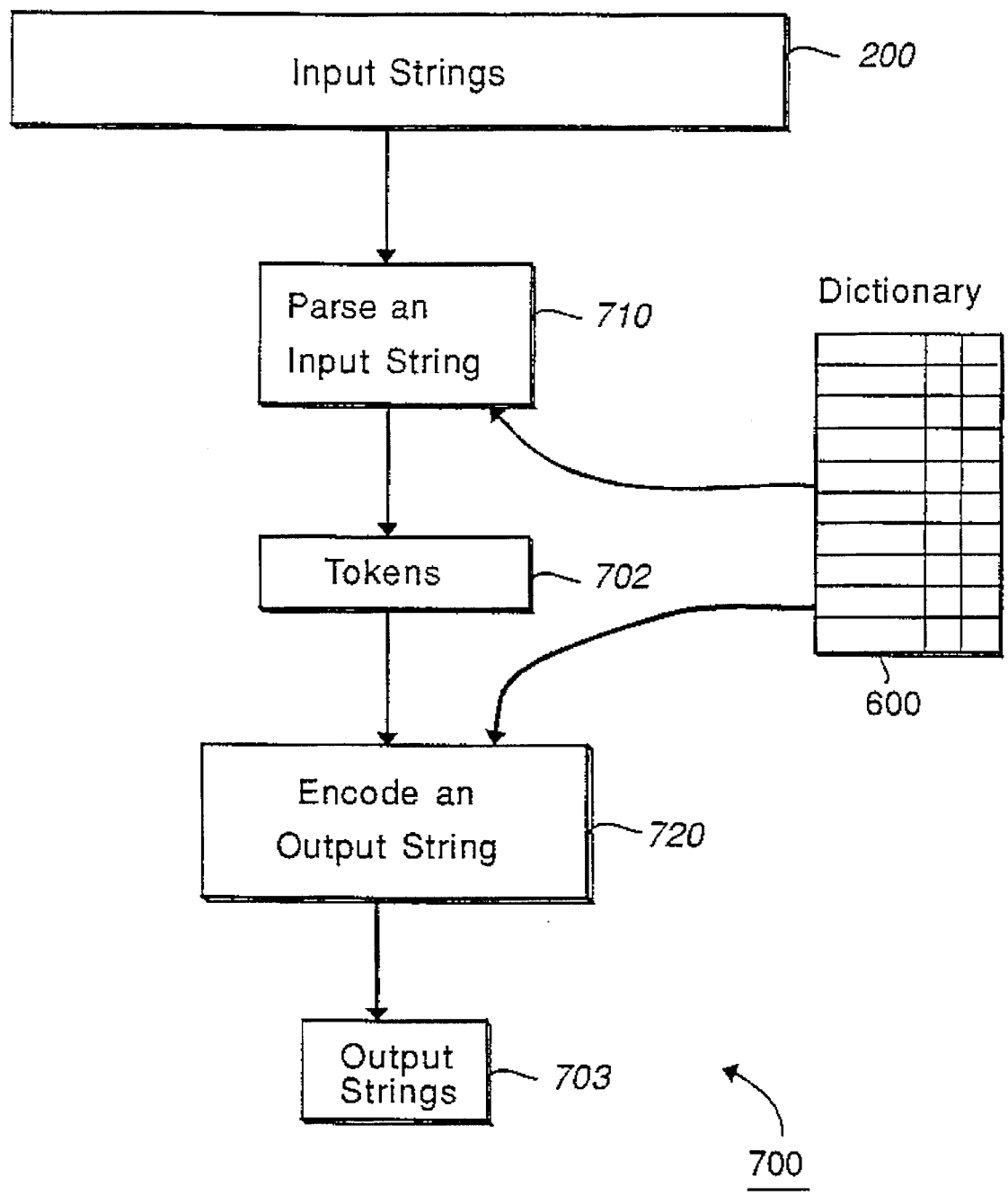
FIG. 7 is a flow diagram for the translating method of the invention.

FIG. 7 shows a preferred embodiment of a process 700 which can be used to translate the strings 200 of FIG. 2 using the encoding dictionary 600 of FIG. 6. It should be noted, and as will be described in further detail below, that in one aspect of the invention the process 700 can be made reversible, That is, as an advantage, the same process and encoding dictionary can be used to encode, and to decode.

In the process 700, the strings 200, one at the time, are provided as an input to a parser 710. The parser 710, using the encoding dictionary 600, produces tokens 702 as intermediate output and input. The tokens 702 are provided as input to an encoder 720, which encodes the tokens to their encoded form, also using the dictionary 600. The encoded form can be output strings 703.

FIG. 8 shows a procedure 800 which can be used to implement the process 700 of FIG. 7. Beginning at 810, a variable IN represents a particular one of the input strings 200 to be translated, e.g., string 201. The variable OUT will contain the corresponding output strings 703. The variable OUT is initialized as an empty string in step 820. The vector D[] represents, for example, the encoding dictionary 600, with each entry D[i], for example, representing one of the rows 621–630 of FIG. 6, and where i is in the range of 1 to N, step 830. Associated with each entry D[i] is one of the ranges $R_i$, e.g., column 610, the prefix $P_i$ of the range, column 611, and the encoding $E_i$, column 612, to translate the token, step 840.

Then, as long as the particular input string IN is not empty, step 850, search the encoding dictionary 600, e.g. i=1 to 10, for a particular range $R_i$ of sub-strings which include a leading sub-string of the string 200, the leading sub-string begins with the first, or left-most character of the string 200, step 860. Since the dictionary is "complete" this search is guaranteed to be successful. The search of the dictionary 600 can be performed by comparing, in the collated order, each entry with the leading sub-string of the input string IN until a match is detected. During each comparison, the length of the entry dictates the length of the leading sub-string.

For the matching range entry $R_i$, truncate the input string IN by the corresponding prefix pattern $P_i$ in step 870. The portion of the input string which is truncated is a parsing token. In step 880, concatenate the output string OUT with the encoding $E_i$ corresponding to the token which was produced by the truncating step 870. Repeat the searching, truncating and concatenating steps 860, 870, and 880 until the entire input string IN has been parsed and encoded. Repeat the parsing and encoding for each subsequent one of the strings 200, until all of the strings 200 have been translated. It should be understood that other data structures can be used to implement the encoding dictionary 600, and other search techniques, for example, a binary search, can be used to search the dictionary 600.

What has been described so far is a translating method which can totally transform an input string into a translated form. It may also be required that the encoding be order preserving, and that the input strings can be fully recovered from the output strings. However, unlike during encoding, a given sub-string during decoding must have exactly one translation to give an unambiguous recovered input string.

The simplest form of order preserving encoding is one in which the encodings themselves are completely ordered. A possible encoding, e.g. column 612, which satisfies this requirement is derived simply by assigning sequential numbers to the encodings E1–E10, e.g. the number 0 through 9. It is assumed here that each encoding can be expressed in the same number of bits, for example, four. Since it is possible for a single pattern to appear more than once in the encoding dictionary 600 due to the following context, there may not be a one-to-one correspondence between the patterns of the list 400, and the ranges, e.g. the encodings of column 612 of FIG. 6.

It is necessary to understand the correct way to order encodings, e.g. column 612 of FIG. 6, that do not have the prefix property, e.g., encodings that require an examination of the trailing context. In the case where there are two encodings, e.g., a first encoding is a prefix of a second, it is impossible to determine which of the two encodings precedes in sort order without making an assumption about what follows the shorter of the two sub-strings.

The assumption that is usually implicitly made for comparison purposes is that a shorter string is followed by binary zeros, and hence longer strings will always compare high to a shorter string. However, as permitted here, when a sub-string is embedded in a longer sub-string, its following context can potentially be many other strings. Hence, sub-strings need to be ordered as described below.

FIG. 9 shows a procedure which can be used for correctly ordering encodings according to a preferred embodiment of the invention. In step 910, let the variable STR1 represent a first sub-string which immediately precedes a second sub-string STR2 in the interval of all possible sub-string values, e.g. the values of line 500 of FIG. 5. Note that STR1 need not necessarily be a prefix of STR2. Further, let HIGH(STR) be the highest possible sub-string that can follow a particular sub-string, and LOW(STR) be the lowest possible sub-string which can precede the particular sub-string. An encoding of the sub-string STR1 is ENCODE(STR1), and an encoding of the sub-string STR2 is ENCODE(STR2).

Then, in step 920, if ENCODE(STR1) is a prefix of ENCODE(STR2), it is required that:

ENCODE(STR1)||(ENCODE(HIGH(STR1))<ENCODE(STR2)

Otherwise, in step 930, if the ENCODE(STR2) is a prefix of ENCODE(STR1), then the ordering requirement is:

ENCODE(STR2)||(ENCODE(LOW(STR2))>ENCODE(STR1)

where the comparisons are done out to the full length of the longer sub-string, if so needed. It is not necessary to establish HIGH(STR) or LOW(STR) for a length further than the length of the longer sub-string as the comparison must distinguish the ordering at the end of the longest string. Thus, the ordering required for the encoded values is, in fact, identical to the ordering needed of the unencoded values. Thus, there is a complete symmetry about the encoded and unencoded value ordering. When there is symmetry, the same process, e.g., 700 of FIG. 7, can be used for encoding and decoding. The only difference is that the roles of the input and output strings are reversed.

What has been described is bi-directional order preserving translation where the sub-strings, during encoding and decoding, can be of variable length, and the sub-strings can be prefixes of adjacent entries in the encoding dictionary. Indeed, it does not matter whether one is encoding or decoding. For example, the process 700 for translating the input strings 200 is the same as the process for recovering the input strings 200 from the output strings 703.

The encodings and decodings produced by the procedure 700 are unique. However, a given sub-string might be translated differently depending on what follows. This results from context dependent translation according to the principles of the invention. In general, context dependent translation permits more effective compression. The correctness of the method relies, in part, on the following facts.

I. The parsing or tokenization of the input strings is unique; no choices are made in steps of the procedure of FIG. 8.

II. The tokenization is complete; all input strings are parsed.

III. The encoded forms are ordered exactly as the unencoded forms. The entries of the dictionary, e.g. $R_i$, $P_i$, and $E_i$, are individually ordered, when context is considered, identically.

The fact that the decoding satisfies the same constraints as the encoding permits the use of the same procedure with encodings and decodings reversed.

Traditional compression methods, for example, Huffman and Hu-Tucker referenced above, typically use optimal binary trees for encoding. The leaves of the trees represent the encodings, and hence the set of encodings has the prefix property. The trees are optimal in that the "weighted" lengths of the branches or paths to the leaves are minimized. By permitting encodings that do not satisfy the prefix property, as described herein, it is possible to construct encodings that may be more effective at compressing data than Hu-Tucker or Huffman.

Figure 10:
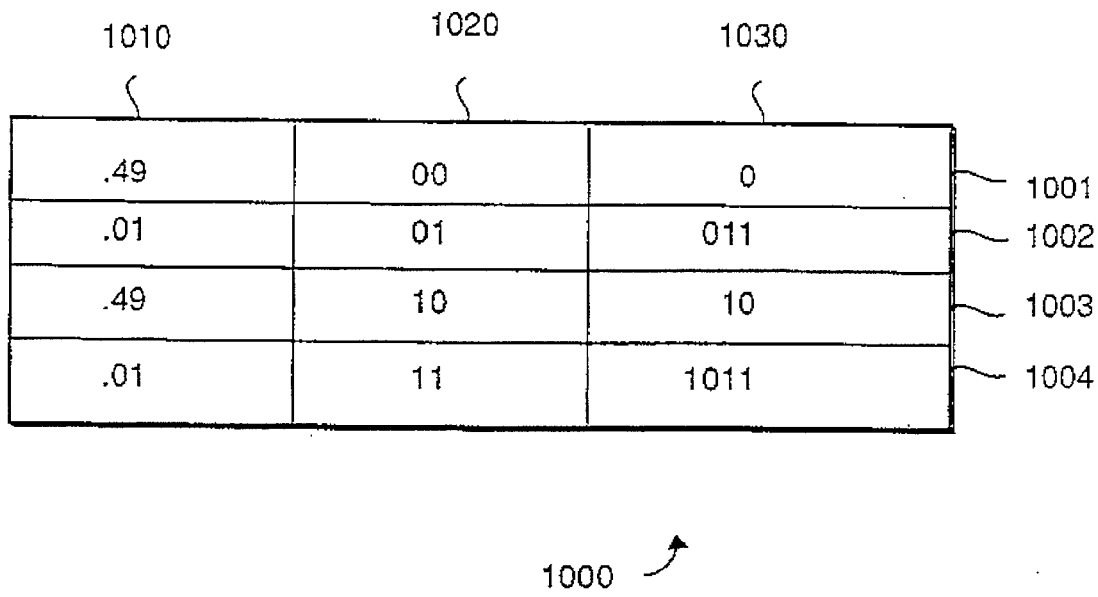
FIG. 10, in tabular format, compares encoding forms.

Consider the example shown in FIG. 10. Here, an alphabet consisting of two bit values, "0" and "1" is used to compose the encodings. The rows 1001–1004 represent entries of a corresponding encoding dictionary. The first column 1010 shows exemplary weighing or relative frequencies for the occurrence of four entries or encodings. Traditional binary tree encoding, for example, Hu-Tucker, is shown in the second column 1020. Encoding according the present method is given in the third column 1030. Note, that the traditional Hu-Tucker encoding requires the prefix property, while the encoding according to the invention does not.

All dictionary entries in the Hu-Tucker encoding, even entries having a relatively high frequency of occurrence, are of length two. More frequently occurring encodings can not be favored. The encodings of the invention, column 1030, are not so constrained. While the present method cannot assign a "1" bit as the encoding for the third entry, row 1003, it can assign a "0" bit for the first entry, row 1001. A "1" bit cannot be assigned for the third entry because the suffix appended to the first entry "0" to form the second entry "011" must be greater than all possible continuations produced by entries one through four. This suffix is the two bits "11" and all entries start with a prefix that is less than the two bits "11". The weighted average length of the strings encoded by the tokens of the Hu-Tucker process is 2.00. In contrast, the invention can reduce the weighted average length of the encodings to 1.54, e.g (0.49×1)+(0.01×4)+(0.49×2)+(0.01×0.4).

To illustrate this advantage further, in an alternative embodiment, the present encoding can be expressed in the form of a binary tree, in a way analogous to what Huffman and Hu-Tucker exploit. However, in the binary tree of the present methodology some of the interior nodes of the binary tree can be used to express encodings as well. In Hu-Tucker, only the leaf nodes represent valid encodings. Thus, the binary tree constructed according this embodiment is more densely populated with codable entries, and a search from the root of the tree to a leaf at the end of a branch is not always required.

Figure 11:
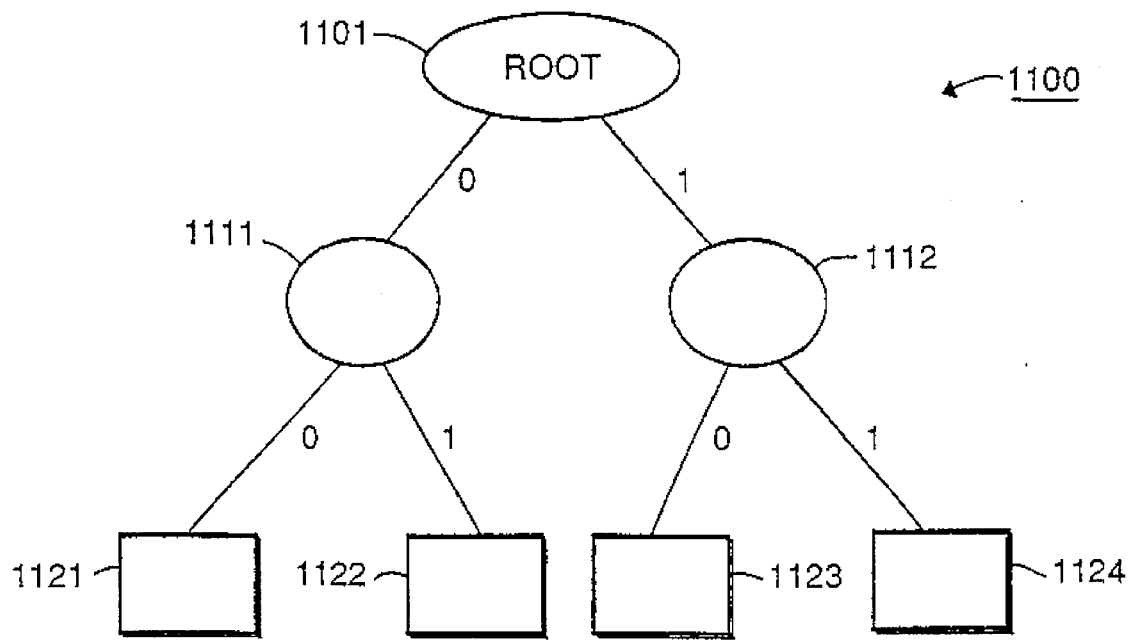
FIG. 11 shows a binary parsing tree of the prior art.
Figure 12:
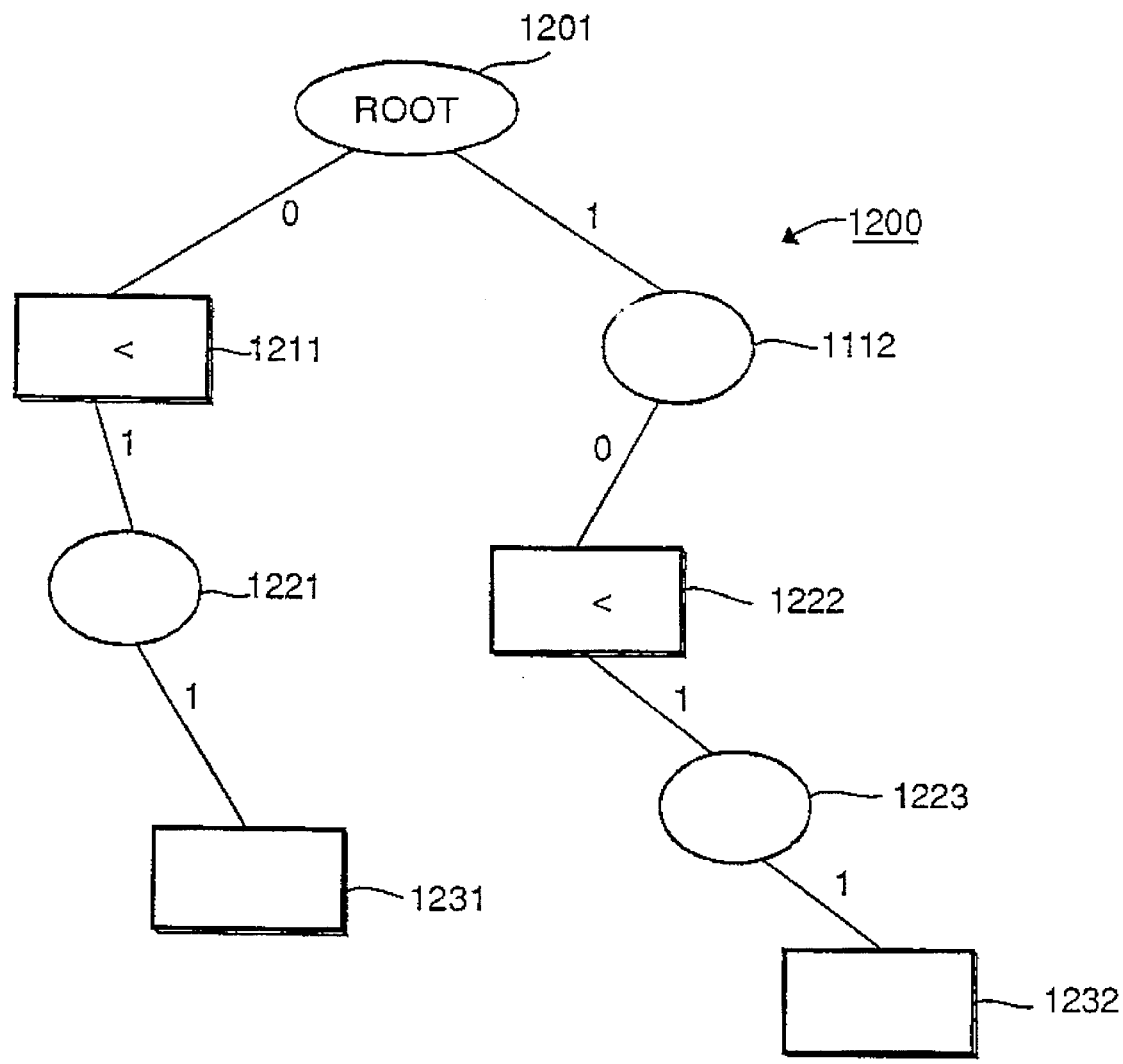
FIG. 12 shows a binary parsing tree according to the invention.

In FIGS. 11 and 12, a traditional "optimal" binary tree 1100, FIG. 11, based on column 1020 of FIG. 10, is compared with an improved binary tree 1200, FIG. 12., constructed according to column 1030 of FIG. 10.

In FIG. 11, the tree 1100 contains a root node 1101, interior first level nodes 1111–1112, and leaf nodes 1121–1024. Only the leaf nodes 1121–924 at the bottom of the tree 1100, shown rectangular, denote encoded entries. The values of the characters associated with the edges designate the characters that cause the edge leading to the node to be traversed. Obviously, every search of the tree 1100, no matter what the frequencies, has a path length of 2.

In FIG. 12, a tree 1200 contains a root node 1201, and interior nodes 1211–1123. There are two leaf nodes 1231 and 1232. In the tree 1200, encodings are associated with the leaf nodes 1231 and 1232, and two interior nodes 1211 and 1222. For interior nodes which are associated with encodings, it is necessary to indicate whether the associated token is less than "<", or greater than ">" the previously traversed token during the parsing tree walk. As described above, the average length of the paths can be reduced from 2.0 to 1.54.

Some parsing methods, e.g. the ZIL method, "Ziv, J., et al, "Compression of Individual Sequences Via Variable-Rate Coding", IEEE Transactions on Information Theory Vol. IT-24, No. 5, September 1978, pages 530–536, are based on an augmented "trie". A trie parses variable length strings and branches taken at any level is determined by the relative position of the characters in the string, rather than the entire string. In another alternative embodiment, the encoding dictionary according to the invention can be mapped to an augmented trie. In a trie, one character of the input string is consumed for each traversal of the tree. The path taken at each branch of the tree is determined by the character following the consumed character.

Figure 13:
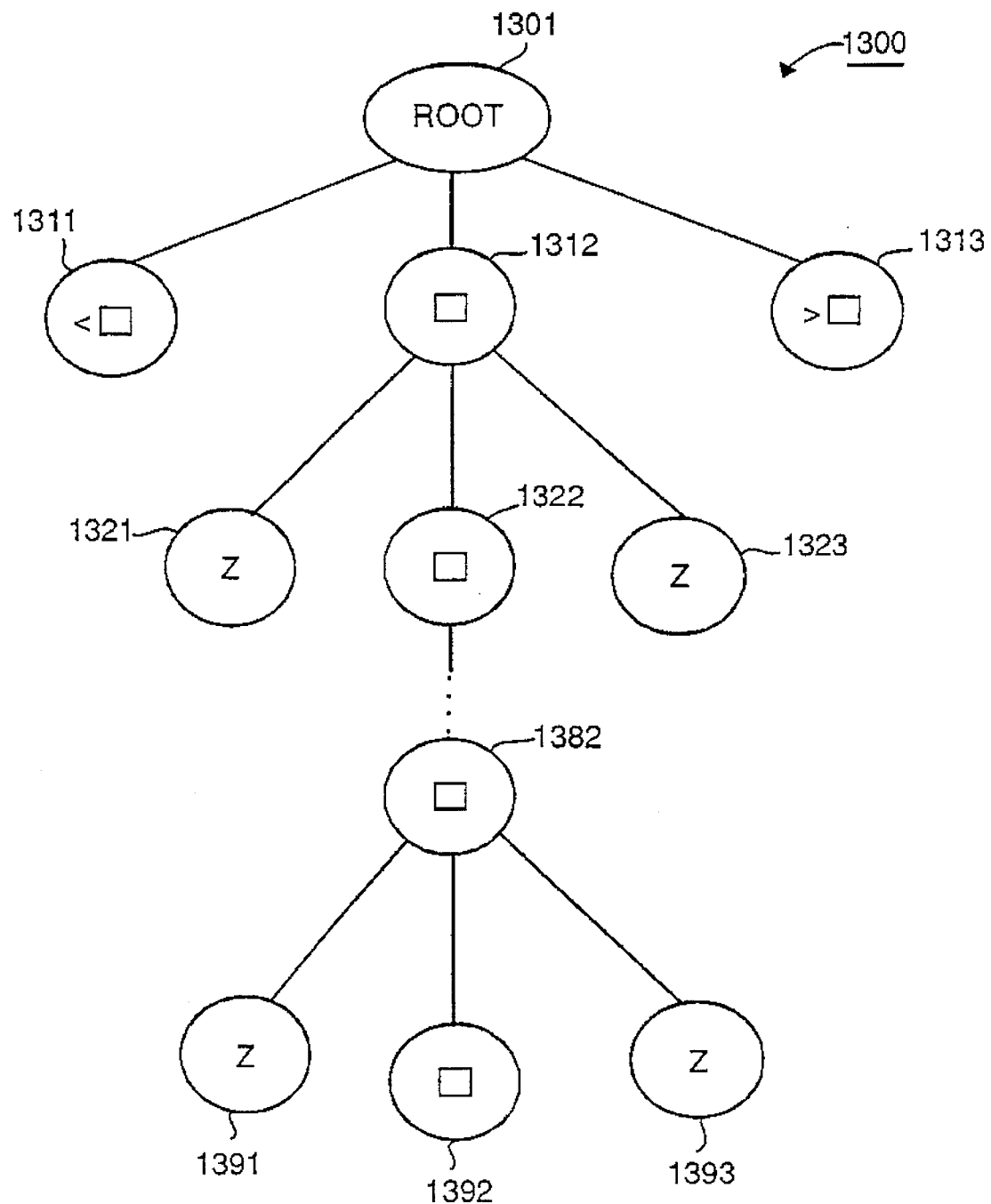
FIG. 13 shows a prior art parsing trie.
Figure 14:
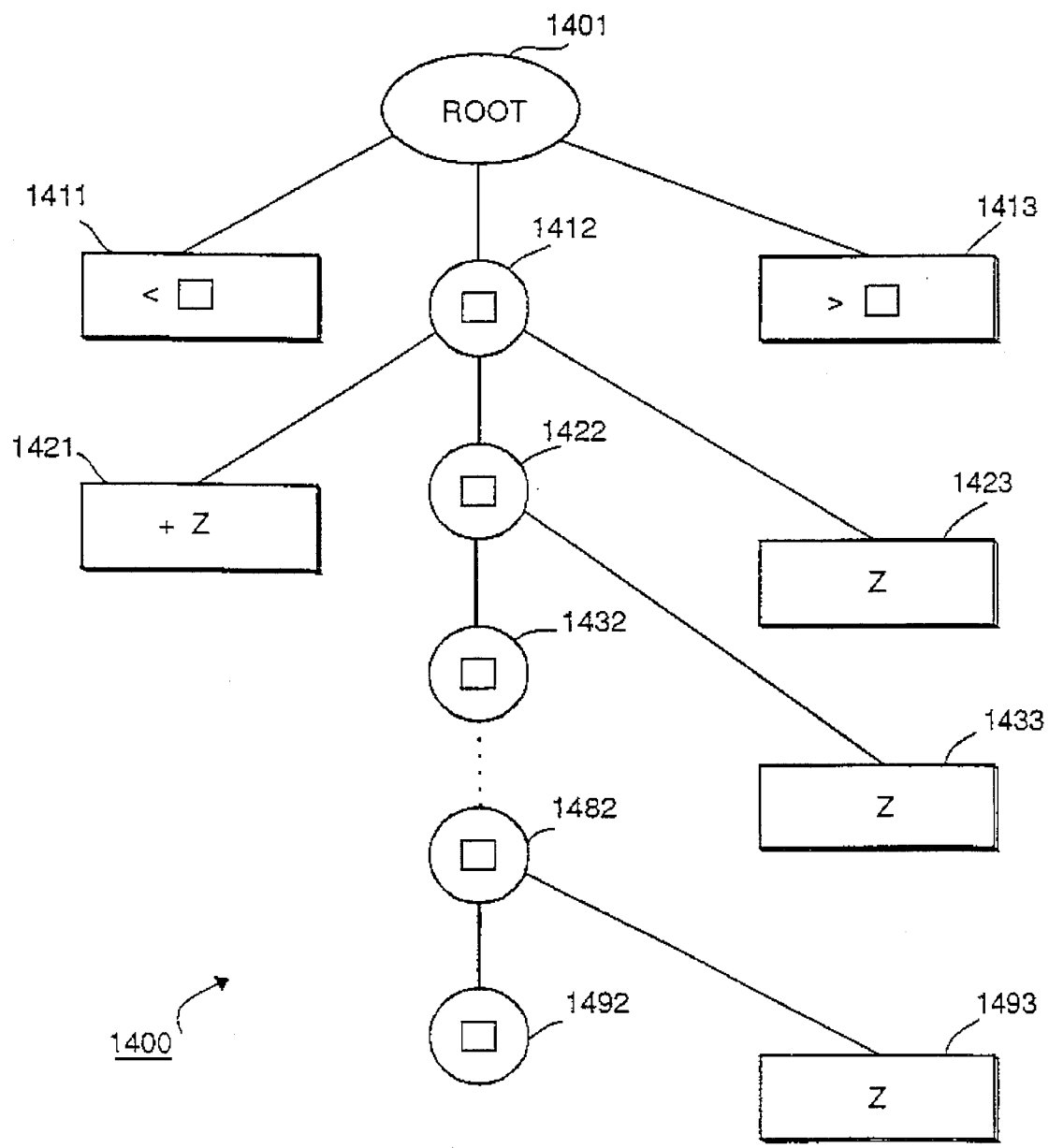
FIG. 14 shows a parsing trie according to the invention.

The following will serve to demonstrate the application of the invention to respect trie-based parsing. In FIGS. 13 and 14, the represented encoding dictionaries, or more correctly "parsing" tries are designed to handel the frequently occurring case of compressing any number of "blank" padding characters in a text. The blank character for visibility is shown as "□". This situation may occur frequently while compressing index keys which typically are extended to a fixed length with blank padding characters.

FIG. 13 shows a traditional trie 1300, according to, for example, ZIL, which can be used for encoding one or more sequential blank characters. The trie 1300 has a root node 1301, three first level nodes 1311–1313, interior level nodes 1321–1323, and bottom level nodes 1391–1393 The character "Z", which stands for a "zilch" character, is used to maintain sort order in the trie 1300 where there are missing leaves. The zilch character "Z" is an imaginary symbol that only occurs as the last symbol of a string, e.g., a terminator. Parsing trees that are full have no need for the zilch symbol since there are no missing leaves. Note that the encoding dictionary, shown in FIG. 13, needs symmetric prefixes; hence, each level of the tree has two encodings. The left side of the trie 1300 gives "before" or "<" encodings, and the right side of the trie 1300 indicates the "after" or ">" encodings.

However, it is not absolutely required that order preserving translations be symmetrical about the strings being translated. Symmetry is only required if it is desired to provide a translation for shorter strings in both contexts. When compressing strings of blank characters, the encoding dictionary can be asymmetrical since there is a very low probability that the character following the blank character will compare low with respect to the blank character, e.g., ASCII hexadecimal 20. Most characters in an ASCII alphabet will compare high to the blank character.

FIG. 14 shows a trie 1400 for encoding and compressing strings of blank characters according to an alternative embodiment of the invention. The trie 1400 has a root node 1401, three first level nodes 1411–1413, three second level nodes 1421–1423, and for subsequent level, two nodes at each level, e.g. 1432–1433, . . . , 1492–1493.

In the trie 1400, in contrast with the trie 1300 of FIG. 13, there is only one "zilch" leaf node 1421 on the left side of the trie. This node is marked with a "+" symbol to indicate that it encodes all sub-strings of padding characters which are shorter than the maximum string length, and which are followed by a sub-string of characters which compare low to blank characters. Nodes for parsing sub-strings of padding characters followed by characters which collate low to the blank character are not required. As an advantage, the parsing trie in accordance of the invention is more compact.

The context dependent data translating of the present invention enables variable length order preserving data compression. It provides a novel forward looking context method for uniquely tokenizing strings. That is, the strings considered for encoding might not occur anywhere, but only within a more bounded set of following strings. This more powerful tokenization can be used to achieve great flexibility in choosing which strings to encode. Moreover, the inventive tokenization can be used to expand the choice of encodings so as to achieve better compression.

The present data compression technique provides constraints that can be tested to ensure that the strings chosen for encoding and the encodings are appropriate. The technique also provides the procedure which, when supplied with the encoding dictionary, does the translation from original text to compressed form, and in reverse.

In contrast, prior art methods, such as Hu-Tucker, only provide a procedure for generating the encoding. The user must supply a) the alphabet, and b) the relative frequencies of character distributions in the strings to be compressed. Only then can an optimal weighted tree be generated. In prior art trees, the tokens associated with the leaf nodes are a set of bit string encodings that must obey the prefix property and that preserve order.

The invention uses a different approach; it provides a way of doing context dependent parsing where sub-strings can be prefixes of other sub-strings. The sub-strings selected for translation, and those which are not, remain the responsibility of the user. As long as the context dependent order is observed for both original and encoded forms, the translation will preserve order.

The invention solves the multifield comparison problem. It very efficiently compresses strings of padding character, and provides a more effective solution than what is known in the prior art. The maximum compression factors achieved for ASCII strings of padding characters can be in the range of 128:2. Compared to ZIL, the present invention permits shorter dictionary entries and does not require that all prefixes of a longest entry be entries that need encoding.

It has also been demonstrated that the present translation method can out-perform known "optimal" tree methods. Thus, the present translation methodology works for Hu-Tucker, indeed for any unique prefix parsing technique. It may also permit encodings that provide greater compression than the Hu-Tucker method.

It will be understood that this invention is not limited to order preserving data translation, or data compression. It can be readily adapted to translate other data structures where context needs to be preserved. Accordingly, the scope and protection of the invention is not limited except as by the following claims.

We claim:

1. In a computer system, a method for processing data stored as input strings, the input strings including a plurality of sub-strings, each sub-string associated with a value, the values of the sub-strings distributed over an interval, the interval of the values including a plurality of ranges of the values, comprising arranging the sub-strings into disjoint sets, each set including the sub-strings having values selected from a predetermined range of the interval of the values, a prefix of the sub-strings of each set being identical; and for each input string repeatedly truncating the input string, by deleting the prefix of a leading sub-string of the input string to produce a token in an output string, until the input strings have been parsed into the tokens of the output strings.

2. The method of claim 1 further comprising associating a unique encoding with each set, and substituting, for each token of each output string, the unique encoding associated with the set which includes the leading sub-string which produced the token, to encode the input strings.

3. The method of claim 2 wherein the input strings comprise characters of a first alphabet, the encodings comprise characters of a second alphabet, and further comprising arranging the predetermined range of the sub-strings of each set according to a predetermined order of the first alphabet, and arranging the unique encodings according to another predetermined order of the second alphabet, there being a one-to-one correspondence between the sets and the encodings to translate the input strings.

4. The method of claim 2 further comprising choosing a weighted average length of the encodings which is less than another weighted average length of the tokens to compress the input strings.

5. The method of claim 3 further comprising selecting the prefix of the sub-strings of each set to partition the plurality of sub-strings into all-inclusive disjoint sets, each sub-string of each disjoint set having a non-empty prefix, there being at least one prefix for each character of the first alphabet to translate any input string comprising characters of the first alphabet.

6. The method of claim 1 wherein the output strings include a plurality of encoded sub-strings, each encoded sub-string associated with an encoded value, the encoded values distributed over an other interval, the other interval of the encoded values including a plurality of other ranges of the encoded values, and further comprising arranging the encoded sub-strings into disjoint encoded sets, each encoded set including an other predetermined range of the encoded sub-strings, an encoded prefix of the encoded sub-strings of each encoded set being identical; and for each output string, repeatedly truncating the output string, by deleting the encoded prefix of a leading encoded sub-string of the output string to produce an encoded token in an input string, until the output strings have been parsed into the encoded tokens of the input strings.

7. The method of claim 6 further comprising associating the prefix of each set with a corresponding encoded set, and substituting for each encoded token of each input string, the prefix associated with the corresponding encoded set which includes the leading encoded sub-string which produced the encoded token, to recover the input strings.

8. The method of claim 3 further comprising representing each set and each corresponding encoding as an entry of a dictionary, each set of ordered sub-strings expressed in the entry as a lower bound and an upper bound of the range of the ordered sub-strings included in the set.

9. The method of claim 8 further comprising for each leading sub-string of each input string, searching the entries of the dictionary for a particular entry expressing a particular range of the sub-strings containing the leading sub-string, and selecting the associated prefix to truncate the input string to produce the token, and selecting the encoding expressed in the particular entry to encode the token.

10. In a computer system, a method for processing data stored as input strings including characters of a first alphabet, the input strings including a plurality of sub-strings, the values of the sub-strings distributed over an interval, the interval of values including a plurality of ranges of the values, comprising arranging the sub-strings according to a predetermined order of the first alphabet, organizing the arranged sub-strings into disjoint sets, each set including sub-strings having values selected from a predetermined range of the values, a prefix of each sub-string of each set being identical; associating a unique encoding including characters of a second alphabet with each set, for each input string repeatedly truncating the input string, by deleting the prefix of a leading sub-string of the input string to produce a token, and substituting in an output string, for each token of each output string, the unique encoding associated with the set which includes the leading sub-string which produced the token, to translate the input strings to the output strings.

* * * * *